United States Patent [19]

Chu et al.

[11] Patent Number: 4,709,754

[45] Date of Patent: Dec. 1, 1987

[54] HEAT TRANSFER ELEMENT WITH NUCLEATE BOILING SURFACE AND BIMETALLIC FIN FORMED FROM ELEMENT

[75] Inventors: Richard C. Chu; Robert E. Simons, both of Poughkeepsie, N.Y.

[73] Assignee: International Business Machines Corp., Armonk, N.Y.

[21] Appl. No.: 921,902

[22] Filed: Oct. 24, 1986

Related U.S. Application Data

[63] Continuation of Ser. No. 756,219, Jul. 18, 1985, abandoned.

[51] Int. Cl.[4] ............................................. F28F 3/06
[52] U.S. Cl. ................................... 165/133; 165/80.4
[58] Field of Search ................................ 165/133, 80.4

[56] References Cited

U.S. PATENT DOCUMENTS

| | | | |
|---|---|---|---|
| 3,684,007 | 8/1972 | Rogi | 165/133 |
| 3,971,435 | 7/1976 | Peck | 165/133 X |
| 4,434,842 | 3/1984 | Gregory | 165/133 |

FOREIGN PATENT DOCUMENTS 172193 10/1982 Japan .................................... 165/133

Primary Examiner—Albert W. Davis, Jr.
Assistant Examiner—Peggy Neils
Attorney, Agent, or Firm—W. S. Robertson

[57] ABSTRACT

A metal foil for use as a heat transfer element has through holes formed as a narrow entrance opening to one surface and a wider diameter cavity opening to the other surface. Two foils are laminated with the narrow entrances opening to the outside and with the wider cavities closed by the inside surface of the other foil. In the completed structure the cavities and their entrances form nucleate boiling sites. In a manufacturing step of forming the through holes, the junction between the narrow entrance and the wider diameter cavity is shaped to prevent a heat transfer liquid from flooding the cavities. The structure is particularly useful for fins for cooling circuit devices that are immersed in a dielectric liquid. In one heat transfer structure, the fins are formed by laminating two metal foils that have differing coefficients of thermal expansion. The fins spread apart as their temperature increases, and components are cooled in proportion to the heat they produce.

6 Claims, 10 Drawing Figures

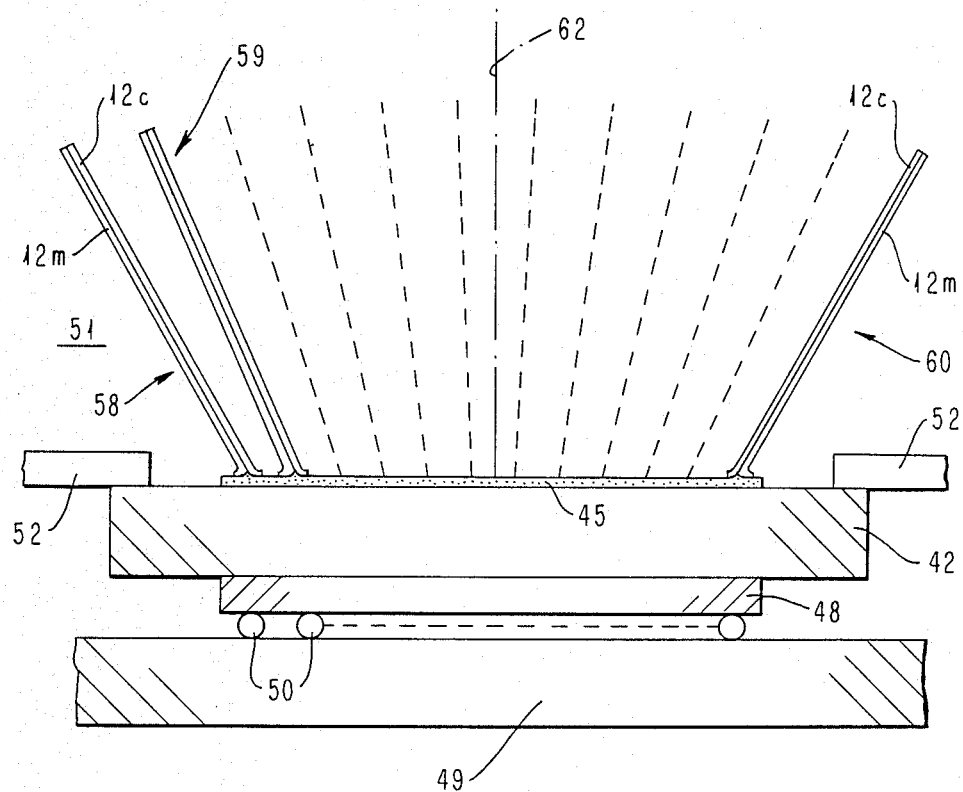

HEAT TRANSFER ELEMENT WITH NUCLEATE BOILING SURFACE AND BIMETALLIC FIN FORMED FROM ELEMENT

RELATED APPLICATIONS

This is a continuation of application Ser. No. 756,219 filed July 18, 1985, now abandoned.

FIELD OF THE INVENTION

This invention relates to heat transfer apparatus and more specifically to a fin structure with an improved nucleate boiling surface. The invention is particularly intended for cooling electronic components but it will be useful in other applications.

DESCRIPTION OF THE RELATED ART

A Review of Chip Cooling

This invention is useful broadly in heat transfer apparatus, but it will be helpful to consider a specific circuit package that would use the invention. A semiconductor chip is mounted on a dielectric chip carrier that contains part of the circuit wiring, and the chip carrier with the chips is assembled with an enclosure or cover that holds a dielectric liquid. Heat is transferred from the chips to the liquid and then from the dielectric liquid to the atmosphere or to a water supply. In some circuit packages heat is transferred from the chip to the dielectric liquid by a mechanism called nucleate boiling.

Introduction to Nucleate Boiling

Nucleate boiling is described in detail in U.S. Pat. No. 4,050,507 of Richard C. Chu and Kevin P. Moran and their explanation will be repeated here only to a limited extent to establish the terminology. When a dielectric liquid is converted to a vapor by boiling, heat from a heat generating subject goes to break the inter-molecular bonds of the liquid and to overcome the pressure of nearby molecules. "Nucleate" means that vapor bubbles form and grow from nucleation sites. The nucleation sites commonly trap bubbles of gas or vapor and these bubbles reduce the temperature required for nucleation. In the apparatus of this invention and in the apparatus of Chu and Moran the nucleation sites are formed by cavities in the surface of the heat generating subject.

FIG. 1 of the Chu and Moran patent is a plot showing different modes of heat transfer that take place at different values of heat flux and temperature excess. (Temperature excess is the difference between the temperature of the heat generating component and the saturation temperature of the dielectric liquid.) The plot illustrates that nucleate boiling handles large increases in heat flux with only small increases in temperature. At a lower temperature, the heat transfer occurs by convection, and at a higher temperature heat transfer occurs by a mechanism called film boiling.

FIG. 12 of the patent shows a cross section of a desirable nucleate boiling cavity, and it will be used to illustrate part of the terminology for this specification. It will be convenient to assign names to the inner walls of the cavity as though the walls of the cavity were built up from separate components even though the demarcation may be faint in an actual device: in the preferred heat transfer elements these names will correspond to particular steps in the method of manufacture. To establish the terminology, the heat transfer element is arbitrarily oriented with its nucleate boiling surface horizontal and facing upward in contact with a boiling liquid. The cavity has a top at the plane of the nucleate boiling surface (or in FIG. 12 the top is rimmed slightly above the surface). The cavity has a bottom remote from this surface. The cavity is jug shaped with a narrow entrance or mouth and a wider main cavity below the entrance. The sides of the main cavity are approximately cylindrical as a a result of the method of forming the cavity, and the main cavity has an approximate predetermined diameter. The surface of the cavity that in FIG. 12 flares outward from the entrance to approximately the predetermined diameter will be called the ceiling, and in FIG. 12 this surface is concave. The approximately horizontal surface at the bottom of the cavity will be called the floor. The heat transfer element can of course be oriented with its nucleate boiling surface in any direction and the same terminology can be used.

FIGS. 2 and 3 of the patent show the growth of a vapor bubble in a nucleate boiling site. Bubbles of gas exist in the cavities because the dielectric liquid contains dissolved gas and because vapor bubbles are formed during the normal operation of the device. The patent also explains that supplemental vapor bubbles can be injected into the dielectric liquid. However, the vapor or gas bubble can be lost from the cavities and this loss causes the nucleate boiling surface to become less effective. Loss of the bubble can be understood best from the viewpoint that the dielectric liquid floods the cavity. One of the objects of this invention is to provide a nucleate boiling surface with cavities which cannot be flooded.

Whether the liquid will flood the cavities depends partly on the surface tension or wettability of the liquid: the liquid floods the cavity because it wets the cavity surfaces that were otherwise in contact with a gas or vapor bubble. FIG. 4 of the patent illustrates the general effect of the surface tension, and FIGS. 5 and 6 show how the dielectric liquid can flood the cavity. The wettability of a liquid is expressed numerically as the contact angle that is formed between a drop of the liquid and a flat substrate. For example, a highly wetting liquid would spread over the substrate into a film and the angle between the surface of the substrate and the surface of the film would approach 180 degrees. A non-wetting liquid would tend to form a sphere touching the substrate at only a point with a contact angle approaching 0 degrees. Typical dielectric liquids have low contact angles and thus more easily flood the cavities. In the cavity of FIG. 12, the narrow cavity entrance reduces flooding.

Flooding can also be inhibited if the liquid is made to flow over angles in the surface as it spreads into a cavity. In the analysis to calculate whether the liquid will flood the cavity, an angle in this path is combined with the contact angle. It is known that the cavity shape of FIG. 12 would be improved if the surface between the entrance and the side walls were concave, flaring outwardly and upwardly from the entrance to the side walls, instead of outwardly and downwardly. This shape produces an angle of more than 270 degrees in the path that the liquid must take to flood the cavity. A cavity with this shape can be said to have an approximate cardoid shape.

The Prior Art

A general object of this invention is to provide a new and improved heat transfer element with cardoid shaped nucleate boiling cavities. A more specific object is to provide a heat transfer element that is convenient to manufacture. Some of the techniques used in this method and apparatus are well known in the art.

The prior art teaches first making small holes in a thin metal foil and then folding the foil over to form two layers. Except where the holes match up in the two foil parts, each hole is backed by the solid surface of the other foil. Thus, the two foil parts have many small outwardly facing cavities.

SUMMARY OF THE INVENTION

An improved heat transfer element with a nucleate boiling surface is formed by laminating two thin metal foils that each have holes formed in a new way. The outwardly facing surface of the foil will be called the outside, as already introduced, and the inwardly facing surface will be called the inside. In preparing the foils before the lamination step, two part through holes are formed with a larger diameter part opening to the inner surface and forming a main cavity in the heat transfer element and a smaller diameter hole part opening to the outer surface and forming the entrance of the nucleate boiling cavity in the heat transfer element. The sides of the hole steps are generally cylindrical as in the Chu and Moran FIG. 12. The top of the first step forms the ceiling of the cavity and it has a convex shape that produces an angle of greater than 90 degrees in the path of the liquid entering cavity. When two foils are laminated inside to inside, the inner surface of each foil forms the floor of the cavities of the other foil.

In one embodiment of the preferred method the first and second step holes are formed in one punch operation and in another preferred method the first and second steps are formed separately.

In one embodiment of the heat transfer article, a ribbon of the foil is then folded inside to inside in a rosette fashion that produces a series of closely spaced fins that extend from a base. The structure provides easy expansion in a direction at right angles to the lines of fins. To provide for thermal expansion in the direction of the fin surface, small cuts are made in the base.

In a further improvement of this structure, the fins are made of two foils of different metals with differing coefficients of thermal expansion so that the bimetal effect causes the fins to bend as they heat. This effect is controlled to cause the fins to fan open when the temperature increases and to thereby allow better circulation of the boiling liquid. When the fin temperature decreases the fins bend closer together and reduce the circulation of the coolant and thereby prevent overcooling the associated component.

Other features of the invention will be apparent from the description of the preferred embodiments of the invention.

The Drawings

Figure 1:
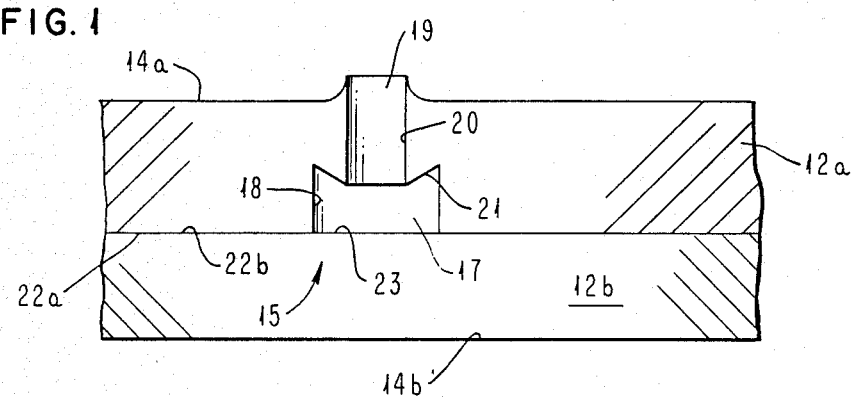
FIG. 1 is a section view of two laminated foils showing a nucleate boiling cavity according to this invention.
Figure 5A:
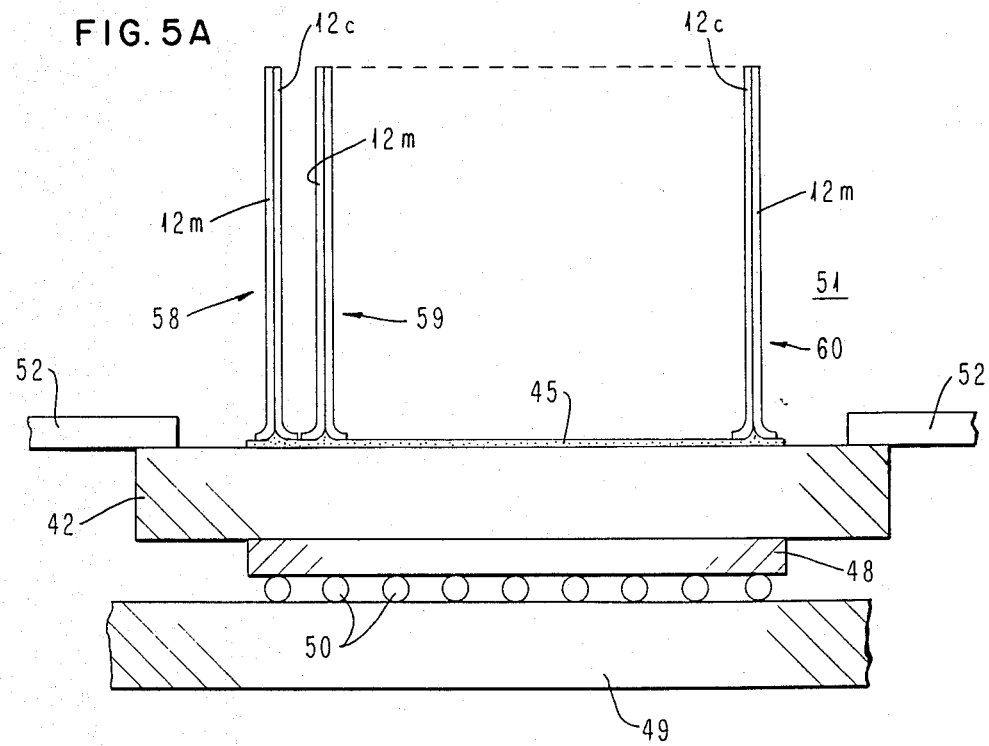

FIGS. 5A and 5B are section views of a circuit package using fins having the nucleate boiling surface of FIG. 1. FIG. 5A shows the fins closely spaced to reduce the coolant flow and FIG. 5B shows the fins spread apart for enhanced coolant flow. FIGS. 5A and 5B also illustrate a bimetal fin structure that automatically adjusts the fin spacing for temperature control.

THE PREFERRED EMBODIMENT

1. The Nucleate Boiling Cavity - FIG. 1

The general shape of the nucleate boiling cavity has been introduced earlier in this specification. FIG. 1 shows a section of a foil 12a having a surface 14a that faces a boiling liquid (not shown). The nucleate boiling cavity 15 has a main cavity 17 with a generally cylindrical side wall 18 and an entrance 19 with a generally cylindrical side wall 20. Between side walls 18 and 20 the cavity is bounded by a convex ceiling 21. Foil surface 22a is designated the inside surface and it faces the inside surface 22b of a second foil 12b. Surface 22b forms the floor 23 of cavity 15.

For most applications of this invention, foil 12b has similar nucleate boiling cavities opening to its outer surface 14b. From an alternative viewpoint, element 12b in FIG. 1 represents any heat transfer element to which foil 12a might be attached to provide a nucleate boiling surface or any suitable structure to provide floor 23 for cavity 15.

2. The Manufacturing Method - Introduction

Figure 3:
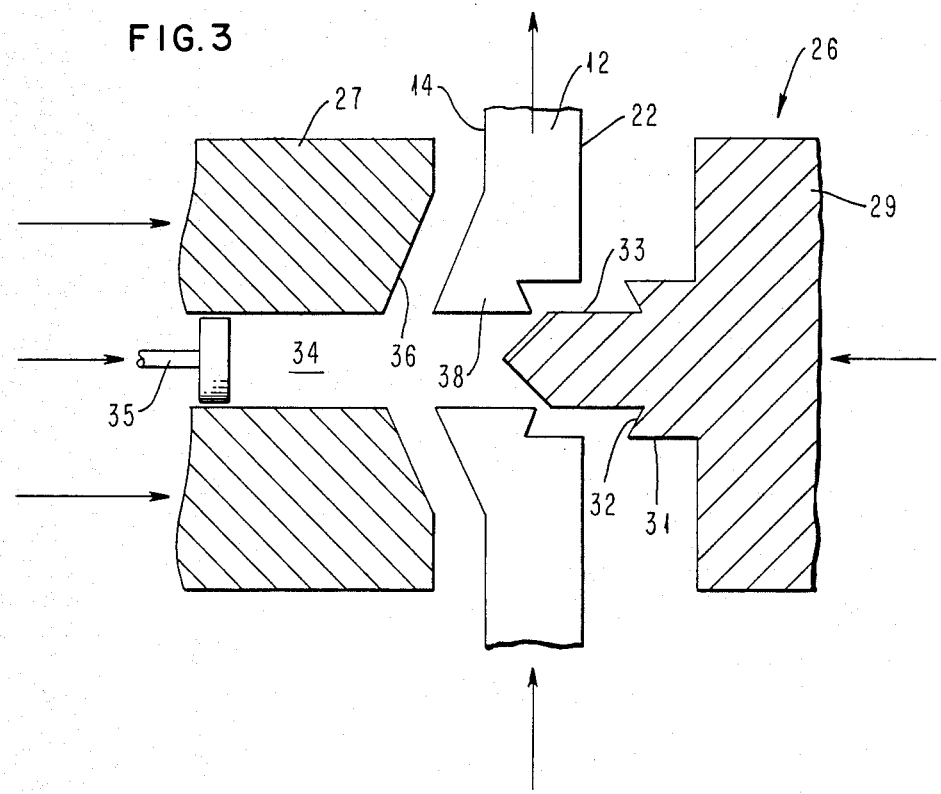
FIG. 3 shows a punch and die and a section of a foil where a hole has been punched that will become a nucleate boiling cavity in the completed heat transfer structure.

In one embodiment of our method the main cavity 17 is formed in a first step and the entrance 19 is formed in a second step and in another embodiment the main cavity and entrance are formed in a single step. FIG. 2 illustrates the method using two steps and FIG. 3 illustrates the method using one step. Both FIGS. 2 and 3 illustrate features that are useful in either method. It will be convenient to describe the physical structure of the nucleate boiling cavity as though the cavity 17 and entrance 19 were distinct entities formed in separate steps.

3. The Method and Heat Transfer element of FIGS. 2A to 2D

Figure 2A:
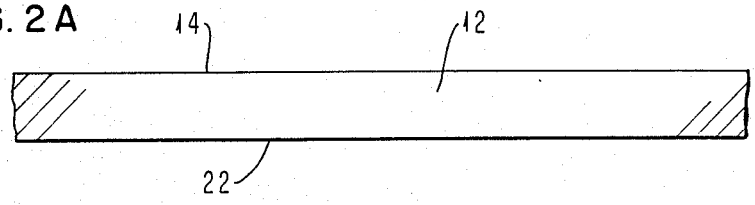
FIGS. 2A through 2E show a section view of a foil in a sequence of steps for forming the nucleate boiling cavities and folding the foil into the laminated heat transfer structure of FIG. 1.
Figure 2B:
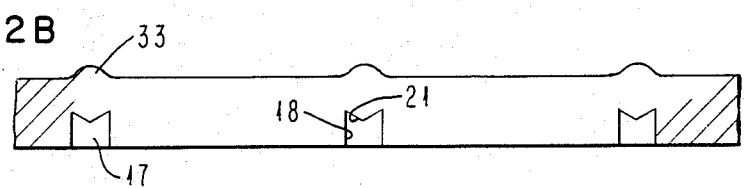
Figure 2C:
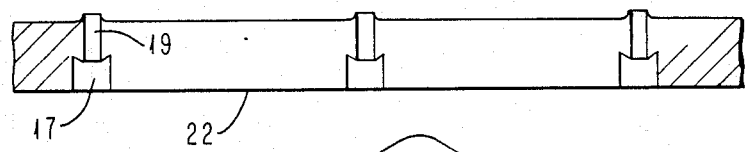
Figure 2D:
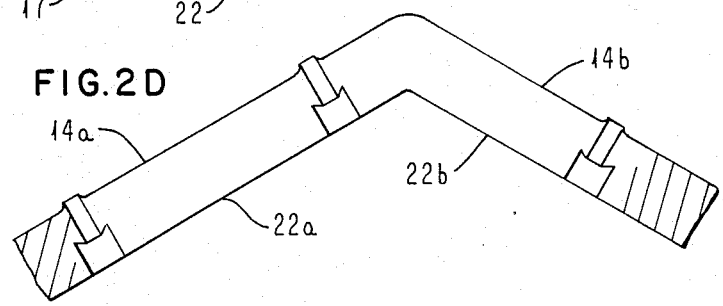
Figure 2E:
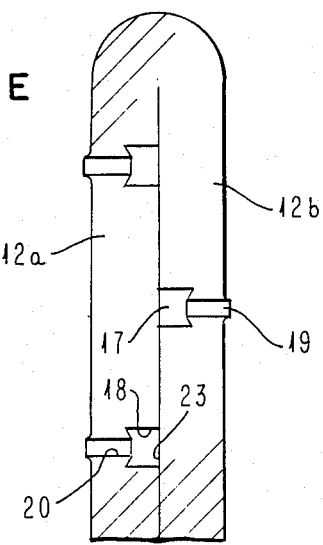

FIG. 2E is an edge view of two laminated foils 12a, 12b and will be familiar from the description of FIG. 1. FIGS. 2A-2D show manufacturing steps that include folding a single foil to form the two layer structure of FIG. 2E. Reference characters 12, 14 and 22 (without subscripts) identify the unfolded foil and its outer and inner surfaces respectively to correspond to the terminology of the individual foils. A dashed line extends through the edge views of the foil and identifies a point of folding the foil to form the distinct foils 12a and 12b of FIG. 1. In FIG. 2E the dashed line coincides with the meeting surface of the two inside surfaces 22a, 22b.

The unfolded foil 12 in FIG. 2A is a sheet of copper or aluminum or other metal or metal alloy that has good heat conductivity. The preferred foil is also easily punched and easily bent into the final folded fin form. The foil thickness is about 0.1 to 0.2 mm.

FIG. 2B shows foil 12 after an operation of punching from the inside surface 22 to form holes that will be the main cavities 17 in the finished product of FIG. 2E. Only a few holes are shown in the drawing. The holes have substantially cylindrical side walls 18 and they have a convex ceiling 21 as introduced in the description of FIG. 1. The punching operation domes the foil outwardly at points 33 above the holes with material displaced from hole 17. The punching operation will be described more specifically in the description of FIG. 3.

FIG. 2C shows the foil after the step of forming the second hole 19 between the outside surface 14 of the foil and the ceiling 21 of the main cavity 17. Hole 19 is formed by any suitable technique that preserves or enhances the convex shape of the cavity ceiling 21, preferably by punching or mechanical drilling or by laser drilling. Note that the structure of FIG. 2C is achieved whether the holes are formed in two steps as in FIGS. 2B and 2C or in one step as will be described later.

FIG. 2D shows the step of folding the foil, and FIG. 2E shows the completed fin structure with the inside surfaces 22a and 22b in contact. We prefer to form the fin structure with the inner surfaces 22a and 22b in close contact to substantially prevent liquid or gas or vapor from moving from one cavity to another. However, it has been proposed to interconnect nucleate boiling cavities so that liquid or gas can move between the cavities, and the method and structure of FIGS. 2A–2E are readily adaptable to provide any desired degree of communication between the cavities.

4. The Punch and Die - FIG. 3

FIG. 3 shows the foil 12 of FIG. 1 with a punch 26 facing the foil inside surface 22 and a die 27 facing the foil outside surface 14. Suitable punching techniques are well known, and the components of the punch are shown diagrammatically. The punch and die are positioned in the drawing to show their relationship to the surfaces of the hole formed in the foil but the positions correspond to retracting the die and the punch after a punching operation.

Punch 26 has a base 29, and it has surfaces 31, 32 and 33 that form respectively the sidewall 18 and ceiling 22 of the main cavity and the sidewall entrance 19. Die 27 has a hole 34 that receives the material (not shown) that is removed from the entrance of the cavity and an ejector 35 drives the material out of the hole at the end of the punching operation. The die has a conical depression 36 that permits the foil to be displaced in a conical rim 38 as material is moved out of the region of the main cavity.

It will be apparent that the punch for the method of FIG. 2 is a simplification of the punch shown in FIG. 3, without part 33 that forms the surface 18 of entrance 19 and with the surface 32 formed as a concave cone corresponding to the unfinished ceiling 21 in FIG. 2B.

5. A Circuit Package - FIG. 4

Figure 4:
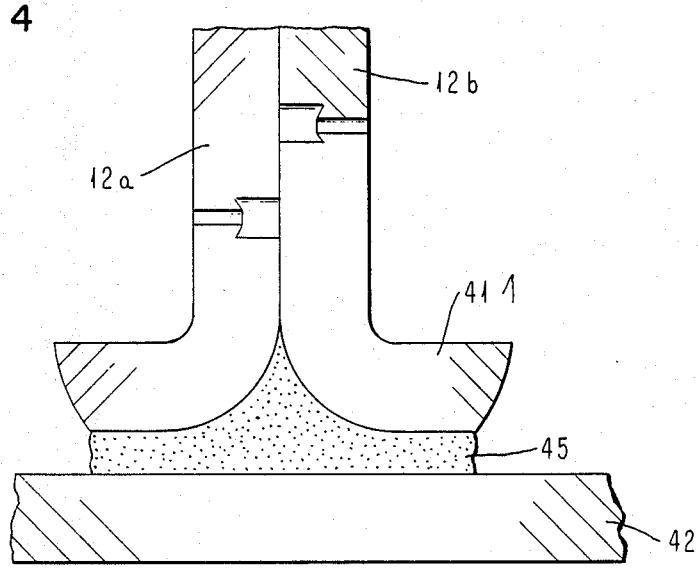
FIG. 4 is a section view of a fin structure using the nucleate boiling foil.

FIG. 4 is similar in part to FIG. 2E but additionally shows the foils 12a, 12b bent in a sinuous shape to form a series of fins that are spaced apart by an intervening single layer of the foil forming a base 41 for attachment to a heat generating subject such as a silicon chip (not shown) or, equivalently, to an intermediate heat transferring subject 42. As is conventional in attaching metal fins to a silicon chip, a molybdenum pad 42 is attached to the pad by means such as solder 45. (Molybdenum and silicon have similar coefficients of thermal expansion and the molybdenum pad isolates the chip from the expansion of the foil.) To accommodate thermal expansion differences perpendicular to the plane of the drawing, fine slits are formed in base parts 41 in the right—left direction in the plane of the drawing. The folded fin structure accommodates thermal expansion differences in the right—left direction in the plane of the drawing.

6. A Temperature Regulating Fin Structure - FIGS. 5A and 5B 5A and 5B show the molybdenum pad 42, and solder 45 of FIG. 4 and additionally show a conventional chip 48, chip carrier 49 and solder balls 50 that electrically and mechanically interconnect conductive pads on the chip and pads on the chip carrier. (The thin pads are not shown in the drawing.) An enclosure, not shown, contains a liquid dielectric, represented by the reference character 51. Optionally, a barrier 52 separates chip 48 from the dielectric liquid. The barrier can be made of a flexible metal or polymer material.

FIG. 5A shows the fins extending co-parallel and perpendicular to the back of the chip, and FIG. 5B shows the fins spread apart. The dielectric liquid 51 is circulated through the fins, either by a pump or by temperature differences, and the fanned out fins of FIG. 5B permit increased circulation and increased cooling. The folded fin structure of FIGS. 2E and 4 can be fixed in any suitable spacing to provide a selected amount of cooling. In a circuit package with several chips that operate at different power, and thereby have different cooling requirements, the fins of higher powered chips can be set wider apart and the fins of lower powered chips can be set closer together to provide sufficient cooling for the higher powered chips without over cooling the lower powered chips.

FIGS. 5A and 5B also show a bimetal fin structure that provides a self adjusting heat transfer element. In representative fins 58, 59 and 60, the two foils are not folded from a single sheet but are of separate materials that have different coefficients of thermal expansion. Suitable metals are a soft copper and molybdenum, and the foils are designated 12c and 12m for the higher coefficient material and the lower coefficient material respectively. The layers 12c and 12m are suitably laminated, for example by soldering or by an adhesive. An increase in temperature causes the bimetal structure to bend in the direction of the foil 12m having the lower coefficient of expansion, and the foils are arranged symmetrically about the mid line 62 of the chip so that the fins fan out as shown in FIG. 5B. As FIG. 5B shows, adjacent fins or adjacent sets of fins are made to bend differently so that the outside fins bend more than the fins toward the mid line 62. (If the fins were identical, the fins would bend through equal angles and would actually be slightly closer together in the spread condition of FIG. 5B.)

In one embodiment of the circuit package, the fins are made of progressively different materials for one or both of layers 12c and 12m. In another embodiment of the circuit package, the ratio of the thickness of the layers 12c and 12m is varied: the high coefficient layer 12c is made thicker for fins near the mid line or, conversely, the low coefficient layer 12m is made thinner for fins near the outside.

Other Embodiments

The repeating fin structure of FIG. 4 will be useful in many applications. For example, the base 41 can be attached to the inside of a pipe that carries a liquid to be boiled or to the outside of a pipe that is submerged in a liquid to be boiled.

Other applications and suitable modifications will be apparent within the spirit of the invention and the intended scope of the claims.

What is claimed:

1. A heat transfer element containing nucleate boiling cavities providing a nucleate boiling surface, comprising:
    a metal foil, the surfaces of the foil being designated "outer" and "inner", the foil having a plurality of through holes formed as a larger diameter hole opening to the inner surface and forming a main cavity in the heat transfer element and a smaller diameter hole opening to the outer surface and forming the entrance of the nucleate boiling cavity in the heat transfer element,
    the foil in the region of the intersection of the main cavity and the entrance being shaped to reduce flooding of the main cavity by an operation of punching the main cavity hole from the inside of the foil with a punch having an inverted cone shape complementary to the shape of the ceiling of the main cavity,
    a substrate of thermally conductive material, the foil being attached at its inner surface to the substrate whereby the surface of the substrate closes the holes opening to the inner surface and thereby forms the floor of the nucleate boiling cavities.

2. A heat transfer element having a nucleate boiling surface, comprising,
    a first metal foil and a second metal foil, the two surfaces of the foils being designated "outer" and "inner",
    each of said foils having a plurality of through holes formed as a larger diameter hole opening to the inner surface and forming a main cavity in the heat transfer element and a smaller diameter hole opening to the outer surface and forming the entrance of the nucleate boiling cavity in the heat transfer element,
    the foil in the region of the intersection of the main cavity and the entrance being shaped to reduce flooding of the main cavity by an operation of punching the main cavity hole from the inside of the foil with a punch having an inverted cone shape complementary to the shape of the ceiling of the main cavity,
    the foils being attached at their inner surfaces as a two layer structure with the inner surface of each foil forming the bottom of a nucleate boiling cavity for the holes of the other foil.

3. The heat transfer element of claim 2 wherein the inner surfaces of the foils are substantially contiguous to prevent fluid communication between cavities.

4. The heat transfer element of claim 2 wherein the first and second foils are formed by folding a single foil along a line separating portions designated the first foil and the second foil.

5. A heat transfer element containing nucleate boiling cavities providing the heat transfer element with a nucleate boiling surface for heat transfer to a liquid in contact with the surface, comprising:
    a metal foil, the surfaces of the foil being designated "outer" and "inner", the foil having a plurality of through holes formed as a larger diameter hole opening to the inner surface and forming a main cavity in the heat transfer element and a smaller diameter hole opening to the outer surface and forming the entrance of the nucleate boiling cavity in the heat transfer element,
    the foil in the region of the intersection of the main cavity and the entrance being designated the ceiling of the cavity, said ceiling having a truncated cone shape inverted to reduce flooding to the main cavity by said liquid,
    a substrate of thermally conductive material, the foil being attached at its inner surface to the substrate whereby the surface of the substrate closes the holes opening to the inner surface and thereby forms the floor of the nucleate boiling cavities.

6. The heat transfer element of claim 5 wherein said foil is designated a "first foil" and wherein said substrate comprises a second foil similar to said first foil, said first and second foils bieng attached at their inner surfaces as a two layer structure with the inner surface of each foil forming the bottom of a nucleate boiling cavity for the holes of the other foil.

* * * * *